United States Patent
Mostovoy et al.

(10) Patent No.: US 10,695,804 B2
(45) Date of Patent: Jun. 30, 2020

(54) EQUIPMENT CLEANING APPARATUS AND METHOD

(71) Applicant: Applied Materials, Inc., Santa Clara, CA (US)

(72) Inventors: Roman M. Mostovoy, San Francisco, CA (US); Suketu Arun Parikh, San Jose, CA (US); Todd Egan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 193 days.

(21) Appl. No.: 15/879,677

(22) Filed: Jan. 25, 2018

(65) Prior Publication Data
US 2019/0224723 A1    Jul. 25, 2019

(51) Int. Cl.
*B08B 7/00* (2006.01)
*B08B 5/04* (2006.01)
(Continued)

(52) U.S. Cl.
CPC ............. *B08B 7/0021* (2013.01); *B08B 5/04* (2013.01); *B08B 13/00* (2013.01); *B08B 15/04* (2013.01);
(Continued)

(58) Field of Classification Search
CPC ....... B08B 15/04; B08B 13/00; B08B 7/0021; B08B 5/04; G01N 2015/0053; G01N 15/0625; H01L 21/02101
See application file for complete search history.

(56) References Cited

U.S. PATENT DOCUMENTS 4,898,471 A * 2/1990 Vaught ................... G01N 21/94
356/237.4
5,253,538 A 10/1993 Swick et al.
(Continued)

FOREIGN PATENT DOCUMENTS

KR    101710859 B1    3/2017
TW    200717627 A    5/2007
(Continued)

OTHER PUBLICATIONS

PCT Notification of Transmittal of the International Search Report and the Written Opinion of the International Searching Authority for International Application No. PCT/US2018/059651; dated Feb. 25, 2019; 9 total pages.
(Continued)

*Primary Examiner* — Alexander Markoff
(74) *Attorney, Agent, or Firm* — Patterson + Sheridan LLP

(57) ABSTRACT

Embodiments described herein relate to a cleaning device and methods for cleaning an object. In one embodiment, the object is cleaned by moving a clean head along a surface of the object. Supercritical carbon dioxide fluid is delivered by supercritical carbon dioxide fluid vessel to the surface of the object. The supercritical carbon dioxide fluid and contamination material are removed from the object by a vacuum pump to a detector. One or more measurements of the contamination material are determined by the detector. Samples of the contamination material are collected by a collector. A contamination level of the surface of the object is determined by an analyzer.

19 Claims, 3 Drawing Sheets

(51) Int. Cl.
   *B08B 15/04*   (2006.01)
   *H01L 21/02*   (2006.01)
   *G01N 15/06*   (2006.01)
   *B08B 13/00*   (2006.01)
   *G01N 15/00*   (2006.01)

(52) U.S. Cl.
   CPC ... *G01N 15/0625* (2013.01); *H01L 21/02101* (2013.01); *G01N 2015/0053* (2013.01)

(56) References Cited

U.S. PATENT DOCUMENTS

| | | | | |
|---|---|---|---|---|
| 5,669,979 | A * | 9/1997 | Elliott | B08B 7/0042 134/1 |
| 5,821,175 | A * | 10/1998 | Engelsberg | B08B 7/0042 438/795 |
| 5,865,901 | A * | 2/1999 | Yin | B08B 3/00 134/2 |
| 5,958,268 | A * | 9/1999 | Engelsberg | B08B 7/0042 219/121.84 |
| 6,048,588 | A * | 4/2000 | Engelsberg | B08B 7/0042 134/1 |
| 6,091,843 | A * | 7/2000 | Horesh | G01N 21/64 250/461.1 |
| 6,398,875 | B1 | 6/2002 | Cotte et al. | |
| 6,747,243 | B1 * | 6/2004 | Reinhardt | H01L 21/67028 219/121.69 |
| 9,174,304 | B2 * | 11/2015 | Minehara | G21F 9/005 |
| 2002/0083780 | A1 | 7/2002 | Lutz et al. | |
| 2003/0142310 | A1 * | 7/2003 | Bedard | G01N 15/0618 356/338 |
| 2004/0244818 | A1 | 12/2004 | Fury et al. | |
| 2005/0279453 | A1 * | 12/2005 | Elliott | B08B 7/0042 156/345.29 |
| 2007/0012337 | A1 * | 1/2007 | Hillman | B08B 7/0021 134/1.3 |
| 2015/0338357 | A1 * | 11/2015 | Mizuno | G01T 7/04 378/45 |
| 2015/0370175 | A1 | 12/2015 | Nicolaides et al. | |

FOREIGN PATENT DOCUMENTS

| | | |
|---|---|---|
| TW | 200938286 A | 9/2009 |
| TW | 201308499 A | 2/2013 |
| WO | 02-15251 A1 | 2/2002 |

OTHER PUBLICATIONS

Office Action for Taiwan Patent Application No. 108101144, dated Dec. 26, 2019, 18 pages.

* cited by examiner

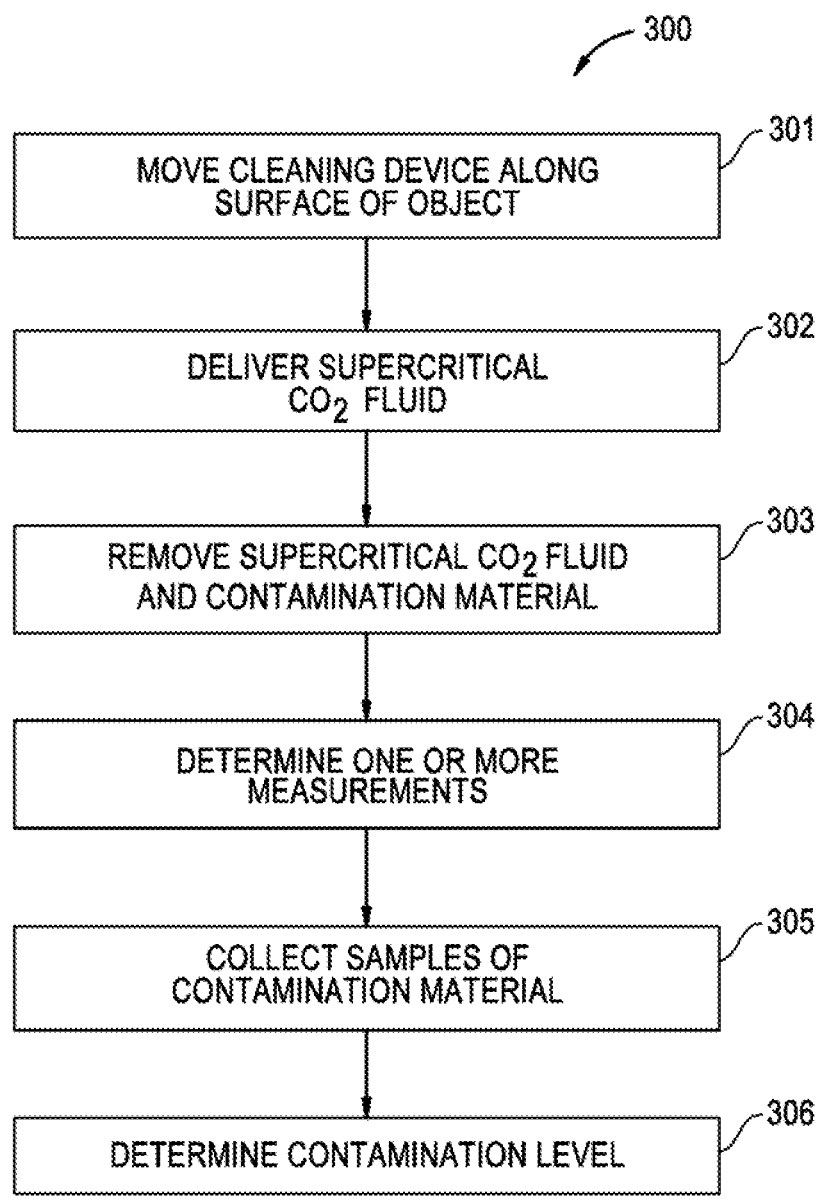

EQUIPMENT CLEANING APPARATUS AND METHOD

BACKGROUND

Field

Embodiments of the present disclosure generally relate to apparatuses and methods to clean equipment. More particularly, embodiments of the present disclosure relate to apparatuses and methods to clean semiconductor, OLED, and flat panel devices.

Description of the Related Art

In the cleaning of semiconductor, OLED, and flat panel devices, it is often desirable to remove contaminants from surfaces of a substrate, thus leaving clean surfaces. For example, during semiconductor processing, the chamber in which the processing occurs oftentimes needs cleaning as well. Absent cleaning, contaminants may be present that will negatively impact semiconductor device performance.

Cleaning the chamber, known as process maintenance or PM, shuts down production. No semiconductor devices can be processed in the chamber during PM. Hence, PM greatly impacts semiconductor device throughput. Therefore, reducing PM time would be beneficial. Cleanliness of semiconductor devices, such as substrates, chamber components, chamber tools, chambers, and chamber mainframes, impacts product yield, chamber uptime, and customer's cost of ownership.

Most current wet cleaning techniques utilize a vacuum cleaner to remove contamination material from the surfaces of the objects to be cleaned. However, using a vacuum cleaner is insufficient to remove the contamination material from the surfaces of the objects and is therefore not time efficient. Additionally, subsequent measurements of the particles and surface contamination require additional time which decreases microchip yield, decrease tool uptime, and increases customers cost of ownership.

Accordingly, what is needed in the art are improved cleaning devices and methods for cleaning objects.

SUMMARY

In one embodiment, a method is provided. The method includes moving a cleaning device along a surface of an object. Supercritical carbon dioxide fluid is delivered to the surface of the object. The supercritical carbon dioxide fluid and contamination material from are removed from the object. One or more measurements of the contamination material are determined. Samples of the contamination material are collected.

In one embodiment, a method is provided. The method includes moving a cleaning device along a surface of a first object. Supercritical carbon dioxide fluid is delivered to the surface of the first object. The supercritical carbon dioxide fluid and contamination material are removed from the first object. One or more measurements of the contamination material from the first object are determined. Samples of the contamination material from the first object are collected. The cleaning device is moved along a surface of a second object. The supercritical carbon dioxide fluid is delivered to the surface of the second object. The supercritical carbon dioxide fluid and contamination material are removed from the second object. One or more measurements of the contamination material from the second object are determined. Samples of the contamination material from the second object are collected.

In another embodiment, a device is provided. The device includes a cleaning head. An optical channel is coupled to an analyzer. The optical channel is coupled to the cleaning head. A detector coupled to the clean head and a collector is coupled to the detector. A vacuum pump coupled to the collector.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 3 is a flow diagram illustrating operations of a method for cleaning an object according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a cleaning device and methods for cleaning an object. In one embodiment, the object is cleaned by moving a clean head along a surface of the object. Supercritical carbon dioxide fluid is delivered by supercritical carbon dioxide fluid vessel to the surface of the object. The supercritical carbon dioxide fluid and contamination material are removed from the object by a vacuum pump to a detector. One or more measurements of the contamination material are determined by the detector. Samples of the contamination material are collected by a collector. A contamination level of the surface of the object is determined by an analyzer.

Figure 1A:
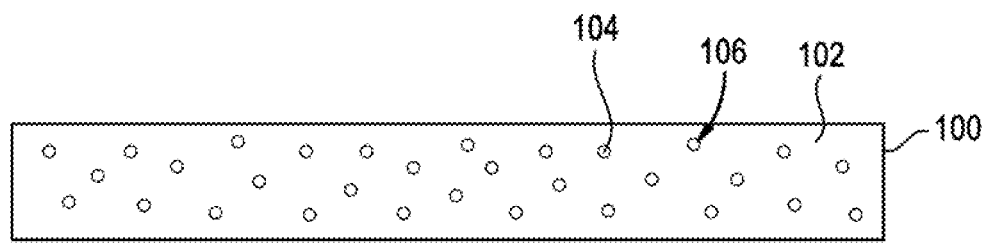
FIGS. 1A-1D are schematic, plane views of an object during cleaning according to embodiments.

FIG. 1A is a schematic, plane view of an object 100 having a surface 102 with contamination material 104 formed on the surface 102 prior to cleaning. The object 100 may be a substrate, chamber component, chamber tool, chamber, and chamber mainframe. The object 100 may have the contamination material 104 formed on the surface 102 prior to processing or after processing. The contamination material may include a plurality of particles 106.

Figure 1B:
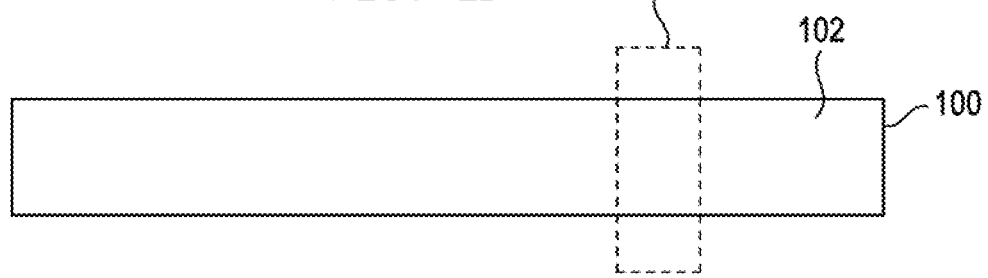
Figure 1C:
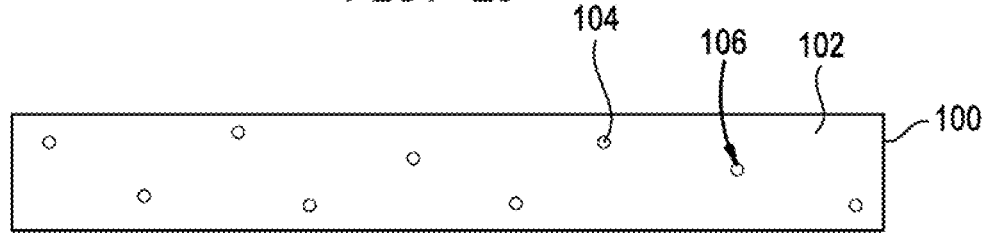

FIG. 1B, is a schematic, plane view of the object 100 having the surface 102 after a cleaning process. As shown in FIG. 1B, the surface 102 of the object 100 is appears to be devoid of the contamination material 104. However, as shown in FIG. 10, an enlarged scale of a schematic, plane view of the object 100 of FIG. 1B, the contamination material 104 is still present on the surface 102. The contamination material 104 is still present on the surface 102 due to inefficiency of removing the contamination material 104 and an inability to determine a contamination level of the surface 102 of the object 100 during the cleaning process.

Figure 1D:
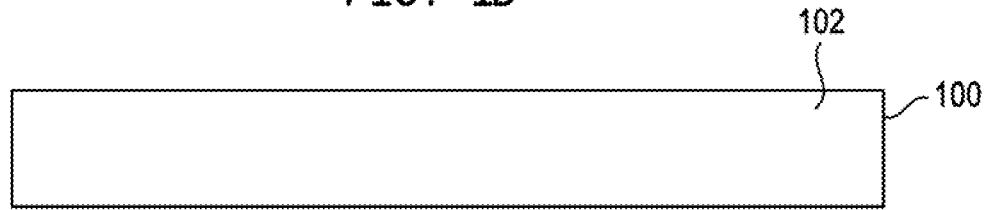

FIG. 1D is an enlarged scale of a schematic, plane view of the object 100 of after a method 300 for cleaning the object 100. The surface 102 of the object 100 is substantially devoid of the contamination material 104. In one embodiment, the object 100 is an incoming chamber component and the method 300 cleans the chamber component prior to incorporation into the chamber. In another embodiment, the chamber and the components of the chamber are cleaned utilizing the method 300 prior to processing. In yet another embodiment, chamber and the components of the chamber component are cleaned utilizing the method 300 after processing as a preventive maintenance and/or troubleshooting practice.

Figure 2:
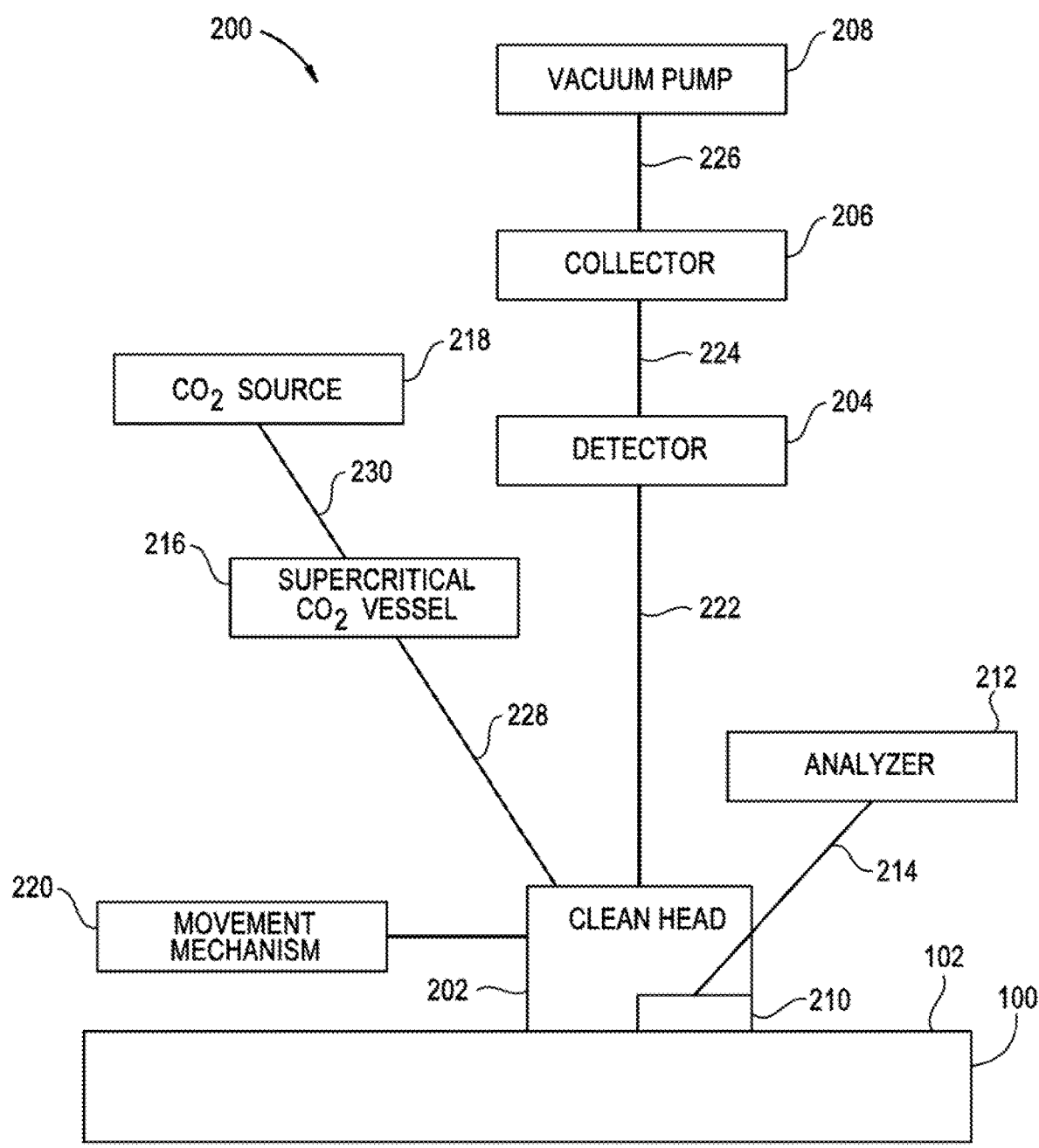
FIG. 2 is a schematic cross-sectional view of a cleaning device according to an embodiment.

FIG. 2 is a schematic cross-sectional view of a cleaning device 200 according to one embodiment. It is to be understood that the cleaning device described below is an exemplary cleaning device and other cleaning devices, including cleaning devices from other manufacturers, may be used with or modified to accomplish aspects of the present disclosure.

The cleaning device 200 includes a clean head 202 having a channel 210 coupled to an analyzer 212. In one embodiment, the clean head 202 is also coupled to a movement mechanism 220. The movement mechanism 220 is operable to move the clean head along the surface 102 of the object 100. In one embodiment, the movement mechanism 220 is configured to autonomously move the clean head along the surface 102 of the object 100. In another embodiment, the movement mechanism 220 is configured to receive signals of input commands from a user and move the clean head along the surface 102 of the object 100. In yet another embodiment, the movement mechanism 220 is the user, and the user physically moves the clean head along the surface 102 of the object 100.

The analyzer 212 is configured to determine a contamination level of the surface 102 of the object 100. In one embodiment, the analyzer 212 is a surface analyst. The surface analyst (such as The Surface Analyst™ available from BTG Labs) is in fluid communication with the channel 210 via an analyst conduit 214. The channel 210 is fitted with an inspection head. Small droplets of probe fluid are distributed on the surface 102 from a pulsed stream of micro drops from the surface analyst. Contact angle measurements are determined from the droplets, which correspond to a measurement of surface cleanliness and energy. The surface analyst may output the contact angle measurements or a pass, warning, or fail output corresponding to whether the contact angle measurements fall within a predetermined pass, warning, or fail range.

The analyzer 212 may be an infrared and/or reflectively spectroscopy analyst. In one embodiment, the analyzer 212 is a Fourier Transform Infrared Spectroscopy (FTIR) analyst (such as the 4300 Handheld FTIR available from Agilent Technologies) and the channel 210 includes one or more optical channels. The FTIR analyst comprises a sensor in optical communication with the channel 210 via the analyst conduit 214 and an infrared light source, such as an infrared light-emitting diode (LED), in optical communication with the channel 210 via the analyst conduit 214. The FTIR analyst is configured to detect hydrocarbon and silicone oil contamination, assess moisture levels, map thermal damage, identify and verify compositions of the contamination material 104, measure oxidative damage of the surface 102 of the object 100 by measuring a grazing angle generated by the light source, reflected of the surface 102, and received by the sensor. The FTIR analyst may output the measurements or a pass, warning, or fail output corresponding to whether the measurements fall within a predetermined pass, warning, or fail range.

In another embodiment, the analyzer 212 is a luminescence spectroscopy analyst (such as the SITA CleanoSpector available from SITA Process Solutions) and the channel 210 includes one or more optical channels. The luminescence spectroscopy analyst comprises a sensor in optical communication with the channel 210 via the analyst conduit 214 and a LED in optical communication with the channel 210 via the analyst conduit 214. The sensor detects residual contamination by measuring fluorescence of the surface 102 of the object 100, which is excited by ultraviolet light from the LED. A photodiode in the sensor head measures the intensity of the fluorescence. The luminescence spectroscopy analyst is also configured to measure the thickness of the residual contamination material. The luminescence spectroscopy analyst may output the fluorescence and/or thickness of the residual contamination material or a pass, warning, or fail output corresponding to whether the fluorescence and/or thickness of the residual contamination are within a predetermined pass, warning, or fail range.

The cleaning device 200 is configured to remove the particles from the surface 102 of the object 100. The cleaning device 200 includes a vacuum pump 208 configured to generate suction and evacuate the contamination material 104 including the plurality of particles 106 from the surface 102 of the object 100 through a first vacuum conduit 222 to a detector 204. The detector is in fluid communication with the clean head 202 via a first vacuum conduit 222. The detector 204 receives the contamination material 104 including the plurality of particles 106 and is configured to determine one or more measurements of the plurality of particles 106.

In one embodiment, the detector 204 is configured to determine a density of each particle of the plurality of particles 106. The detector 204 may be a surface particle detector (such as the QIII® available from Pentagon Technologies) configured to utilize light scattering particle size analysis to determine the density of each particle, an average particle density, and/or a particle density distribution. The surface particle detector may include a light source, such as a laser beam, a fourier lens, flow cell, rear detector, side detectors, and a ring shape detector. The plurality of particles 106 flow through the flow cell. The laser beam is expanded by the fourier lens, propagated to the flow cell, and scattered by the plurality of particles 106 at various angles based on the density of each particle of the plurality of particles 106. The rear detector, side detectors, and a ring shape detector determine the variation of a scattering pattern generated by the various angles to determine the density of each particle, an average particle density, and/or particle density distribution.

A collector 206 is in fluid communication with detector 204 via the second vacuum conduit 224. The collector 206 is configured to collect samples of the contamination material 104 including the plurality of particles 106. The samples of the contamination material may be used for further analysis. In one embodiment, the collector 206 includes a grid on a particle trap. After the object 100 is cleaned, the particle trap is removed for particle imaging and for Scanning Electron Microscopy (SEM) and/or Energy Dispersive X-Ray Analysis (EDX) to determine elemental composition and/or quantitative compositional data of the contamination material 104.

The cleaning device 200 may further include a supercritical carbon dioxide ($CO_2$) fluid vessel 216 in fluid communication with a $CO_2$ gas source 218 via a second $CO_2$ conduit 230. The supercritical $CO_2$ fluid vessel 216 is capable of changing the phase of $CO_2$ gas and sustaining the supercritical $CO_2$ fluid at a supercritical phase temperature and pressure. The supercritical $CO_2$ fluid vessel 216 is in fluid communication with the clean head 202 via a first $CO_2$ conduit 228 and is configured to deliver the supercritical $CO_2$ fluid at a velocity to improve particle lift-off from the surface of the 102 of the object 100. In one embodiment, the supercritical $CO_2$ fluid vessel 216 is configured to deliver the supercritical $CO_2$ fluid at a pressure greater than 500 pounds per square inch (psi). The contamination material 104 including the plurality of particles 106 and supercritical $CO_2$ fluid are removed from the object via the first vacuum conduit 222.

FIG. 3 is a flow diagram illustrating operations of a method 300 for cleaning an object 100. At operation 301, a cleaning device 200 is moved along a surface 102 of an object 100. In one embodiment, the cleaning device 200 includes the clean head 202 having the movement mechanism 220 that is configured to autonomously move the clean head along the surface 102 of the object 100. In another embodiment, the clean head 202 receives signals of input commands from a user and moves along the surface 102 of the object 100. In yet another embodiment, the user physically moves the clean head 202 along the surface 102 of the object 100.

At operation 302, supercritical carbon dioxide ($CO_2$) fluid is delivered to the surface 102 of the object 100. Delivering supercritical carbon dioxide fluid removes contamination material 104 from the surface 102 of the object 100. The contamination material may include a plurality of particles 106. Delivering supercritical $CO_2$ fluid at a velocity removes the plurality of particles 106 from the surface 102 of the object 100. In one embodiment, the cleaning device 200 includes the supercritical $CO_2$ fluid vessel 216 in fluid communication with the $CO_2$ gas source 218 via the second $CO_2$ conduit 230. The supercritical carbon dioxide $CO_2$ fluid vessel 216 changes the phase of $CO_2$ gas and sustains the supercritical $CO_2$ fluid at a supercritical phase temperature and pressure. The supercritical $CO_2$ fluid vessel 216 is in fluid communication with the clean head 202 via the first CO2 conduit 228 and delivers the supercritical $CO_2$ fluid at the velocity to improve particle lift-off from the surface of the 102 of the object 100. The supercritical $CO_2$ fluid may be delivered at a pressure greater than 500 psi.

At operation 303, the contamination material 104 and the supercritical $CO_2$ are removed from the surface of the object 100. In one embodiment, the cleaning device 200 removes the contamination material 104 including the plurality of particles 106 and the supercritical $CO_2$ fluid from the object 100 via the first vacuum conduit 222. The cleaning device 200 includes the vacuum pump 208 that generates suction and evacuates the contamination material 104 including the plurality of particles 106 from the surface 102 of the object 100 through the first vacuum conduit 222 to the detector 204 in fluid communication with the clean head 202 via the first vacuum conduit 222.

At operation 304, one or more measurements of the contamination material 104 are determined. In one embodiment, the detector 204 that receives the contamination material 104 including the plurality of particles 106. The detector 204 determines the density of each particle of the plurality of particles 106. The detector 204 may perform light scattering particle size analysis to determine a density of each particle, an average particle density, and/or a particle density distribution. The detector 204 may include a light source, such as a laser beam, a fourier lens, flow cell, rear detector, side detectors, and a ring shape detector. The plurality of particles 106 flow through the flow cell and the laser beam is expanded by the fourier lens, propagated to the flow cell, and scattered by the plurality of particles 106 at various angles based on the density of each particle. The rear detector, side detectors, and a ring shape detector determine the variation of a scattering pattern generated by the various angles to determine the density of each particle, the average particle density, and/or the particle density distribution. The one or more measurements may be determined during the removal of the contamination material 104 to optimize cleaning time.

At operation 305, samples of the contamination material 104 are collected. In one embodiment, a collector 206 is in fluid communication with the detector 204 via the second vacuum conduit 224 collects samples of the contamination material 104 including the plurality of particles 106. The samples of the contamination material may be used for further analysis. After the object 100 is cleaned, the particle trap is removed for particle imaging and for Scanning Electron Microscopy (SEM) and/or Energy Dispersive X-Ray Analysis (EDX) to determine elemental composition and/or quantitative compositional data of the contamination material 104.

At operation 306, a contamination level of the surface 102 of the object 100 is determined. The contamination level of the surface 102 may be determined prior to removing the contamination material 104 and/or during the removal of the contamination material 104 to determine if substantially all of the contamination material 104 has been removed.

In one embodiment, an analyzer 212, coupled to the clean head 202, determines the contamination level of the surface 102 of the object 100. In one embodiment, the analyzer 212 is a surface analyst that distributes small droplets of probe fluid the surface 102 from a pulsed stream of micro drops from the surface analyst. Contact angle measurements are determined from the droplets, which correspond to a measurement of surface cleanliness and energy. The analyzer 212 may output the contact angle measurements or a pass, warning, or fail output corresponding to whether the contact angle measurements fall within a predetermined pass, warning, or fail range. The output of the contact angle measurements and/or the pass, warning, or fail output may correspond to a target output for a chamber component and/or chamber location. The target output may correspond to an endpoint of the method 300.

In another embodiment, the analyzer 212 is an infrared and/or reflectively spectroscopy analyst. The analyzer 212 may detect hydrocarbon and silicone oil contamination, assess moisture levels, map thermal damage, identify and verify compositions of the contamination material 104, and measure oxidative damage of the surface 102 of the object 100 by measuring the grazing angle generated by a light source, reflected of the surface 102, and received by the sensor. The analyzer 212 may output the measurements or a pass, warning, or fail output corresponding to whether the measurements fall within a predetermined pass, warning, or fail range. The output of the measurements and/or the pass, warning, or fail output may correspond to the target output for a chamber component and/or chamber location.

In yet another embodiment, the analyzer 212 is a luminescence spectroscopy analyst. The analyzer 212 detects residual contamination by measuring fluorescence of the surface 102 of the object 100, which is excited by ultraviolet light from a LED. The intensity of the fluorescence is further determined by the analyzer 212. The analyzer 212 may also measure the thickness of the contamination material 104. The analyzer 212 may output the fluorescence and/or thickness of the residual contamination material or a pass, warning, or fail output corresponding to whether the fluorescence and/or thickness of the residual contamination are within a predetermined pass, warning, or fail range. The output of fluorescence and/or thickness of the residual contamination material and/or the pass, warning, or fail output may correspond to the target output for a chamber component and/or chamber location.

The method 300 may be repeated to clean subsequent objects. For example a chamber may comprise multiple components, each component corresponding to an object 100. A first object is cleaned by the method 300 for cleaning an object 100. The density of each particle, the average particle density, and/or the particle density distribution of the contamination material 104 on the surface 102 of the first object is determined along with the contamination level of the first object. A second object is cleaned by the method 300 for cleaning an object 100. The density of each particle, the average particle density, and/or the particle density distribution of the contamination material 104 on the surface 102 of the second object is determined along with the contamination level of the second object. Subsequent, components of the chamber, each component corresponding to an object 100, are cleaned by the method 300 for cleaning an object 100. A specification of the density of each particle, the average particle density, and/or the particle density distribution of the contamination material 104 on the surface 102 of each object 100 and contamination level of each object 100 is complied. The specification may be used a preventive maintenance and/or a troubleshooting practice based contamination levels within the predetermined pass, warning, or fail range.

In summation, a cleaning device and methods for cleaning an object are described herein. The utilization delivering the supercritical $CO_2$ fluid at a velocity to improve particle lift-off and removing the supercritical $CO_2$ fluid and contamination material allows for substantially all the surface of the object to be devoid of contamination material. Furthermore, determining one or more measurements of the contamination material, collecting samples of the contamination material, and determining the contamination level results in increased microchip yield, increase tool uptime, and decreased cost of ownership.

While the foregoing is directed to examples of the present disclosure, other and further examples of the disclosure may be devised without departing from the basic scope thereof, and the scope thereof is determined by the claims that follow.

What is claimed is:

1. A device, comprising:
   a clean head;
   an optical channel coupled to an analyzer, the optical channel coupled to the cleaning head;
   a detector coupled to the clean head, the detector operable to determine a density of each particle of a contamination material;
   a collector coupled to the detector; and
   a vacuum pump coupled to the collector, the vacuum pump operable to evacuate the contamination material including a plurality of particles to the detector.

2. The device of claim 1, further comprising a movement mechanism coupled to the clean head.

3. The device of claim 1, wherein the analyzer is configured to determine a contamination level.

4. The device of claim 1, further comprising a supercritical carbon dioxide fluid vessel coupled to the cleaning head configured to deliver supercritical carbon dioxide.

5. The device of claim 1, wherein the collector is configured to collect samples of the contamination material.

6. A device, comprising:
   a clean head coupled to a movement mechanism, the movement mechanism operable to move the clean head along a surface of an object;
   an analyzer coupled to an optical channel of the clean head, the analyzer operable to determine a contamination level of the surface of the object;
   a vacuum pump in fluid communication with the clean head via a vacuum conduit;
   a detector in fluid communication with the vacuum pump, wherein:
      the vacuum pump is operable to evacuate a contamination material including a plurality of particles from the surface of the object through the vacuum conduit to the detector; and
      the detector is operable to determine one or more measurements of the plurality of particles of the plurality of particles; and
   a collector coupled to the detector operable to collect samples of the contamination material.

7. The device of claim 6, wherein the one or more measurements operable to be determined by the detector include at least one of a density of each particle, an average particle density, and a particle density distribution of the plurality of particles.

8. The device of claim 7, wherein the detector is a surface particle detector.

9. The device of claim 8, wherein the surface particle detector comprises a light source, a Fourier lens, a flow cell, a rear detector, side detectors, and a ring shape detector.

10. The device of claim 6, wherein the movement mechanism is operable to autonomously move the clean head along the surface of the object.

11. The device of claim 6, wherein the movement mechanism is operable to receive signals of input commands from a user and move the clean head along the surface of the object.

12. The device of claim 6, wherein the analyzer is a surface analyst in fluid communication with the optical channel via an analyst conduit, the analyzer operable to distribute droplets of probe fluid on the surface of the object and determine contact angle measurements or a pass, warning, or fail output corresponding to whether the contact angle measurements fall within a predetermined pass, warning, or fail range.

13. The device of claim 6, wherein the analyzer is a Fourier Transform Infrared Spectroscopy (FTIR) analyst, the FTIR analyst comprising:
   a sensor in optical communication with the optical channel via an analyst conduit and an infrared light source in optical communication with the optical channel via the analyst conduit; and
   the FTIR analyst operable to detect hydrocarbon and silicone oil contamination, assess moisture levels, map thermal damage, identify and verify compositions of the contamination material, and measure oxidative damage of the surface of the object and output spectroscopy measurements or a pass, warning, or fail output corresponding to whether the spectroscopy measurements fall within a predetermined pass, warning, or fail range.

14. The device of claim 6, wherein the analyzer is a luminescence spectroscopy analyst, the luminescence spectroscopy analyst comprising:
   a sensor in optical communication with the optical channel via an analyst conduit and a light emitting diode (LED) in optical communication with the optical channel via the analyst conduit; and
   the luminescence spectroscopy analyst operable to measure at least one of a fluorescence and thickness of a residual contamination material of the surface of the object, and operable to output at least one of the fluorescence and thickness of the residual contamination material or a pass, warning, or fail output corresponding to whether at least one of the fluorescence and thickness of the residual contamination material are within a predetermined pass, warning, or fail range.

15. The device of claim 6, wherein the collector comprises a grid disposed on a removable particle trap.

16. The device of claim 6, further comprising a supercritical carbon dioxide fluid vessel coupled to the cleaning head operable to deliver supercritical carbon dioxide.

17. A device, comprising:
   a clean head coupled to a movement mechanism, the movement mechanism is operable to move the clean head along a surface of an object;
   an analyzer coupled to an optical channel of the clean head, the analyzer operable to determine a contamination level of the surface of the object;
   a vacuum pump in fluid communication with the clean head via a vacuum conduit;
   a detector in fluid communication with the vacuum pump, wherein:
      the vacuum pump is operable to evacuate a contamination material including a plurality of particles from the surface of the object through the vacuum conduit to the detector; and
      the detector operable to determine one or more measurements of the plurality of particles of the plurality of particles, the one or more measurements including at least one of a density of each particle, an average particle density, and a particle density distribution of the plurality of particles; and
   a collector coupled to the detector operable to collect samples of the contamination material.

18. The device of claim 17, wherein a supercritical carbon dioxide ($CO_2$) fluid vessel is operable to be fluid communication with the clean head via a $CO_2$ conduit and is operable to deliver the supercritical $CO_2$ fluid to the surface of the object.

19. The device of claim 17, wherein the detector is a surface particle detector.

* * * * *